(12) United States Patent
Luo et al.

(10) Patent No.: US 10,403,342 B2
(45) Date of Patent: Sep. 3, 2019

(54) HYBRID FLASH MEMORY STRUCTURE

(71) Applicant: Aspiring Sky Co. Limited, Hong Kong (CN)

(72) Inventors: Zhijiong Luo, Hopewell Township, PA (US); Shu Wang, Shanghai (CN); Xiaoming Jin, Shanghai (CN)

(73) Assignee: Aspiring Sky Co. Limited, Hong Kong (CN)

( * ) Notice: Subject to any disclaimer, the term of this patent is extended or adjusted under 35 U.S.C. 154(b) by 0 days.

(21) Appl. No.: 16/011,673

(22) Filed: Jun. 19, 2018

(65) Prior Publication Data

US 2018/0366170 A1    Dec. 20, 2018

Related U.S. Application Data

(60) Provisional application No. 62/522,635, filed on Jun. 20, 2017.

(51) Int. Cl.
| | |
|---|---|
| *G11C 7/10* | (2006.01) |
| *G11C 11/00* | (2006.01) |
| *G11C 7/06* | (2006.01) |
| *G06F 3/06* | (2006.01) |
| *G06F 12/06* | (2006.01) |
| *G11C 13/00* | (2006.01) |
| *G11C 16/08* | (2006.01) |
| *G11C 16/10* | (2006.01) |
| *G11C 16/26* | (2006.01) |
| *G11C 16/28* | (2006.01) |
| *G06F 12/02* | (2006.01) |
| *G11C 8/10* | (2006.01) |

(52) U.S. Cl.
CPC ............ *G11C 11/005* (2013.01); *G06F 3/068* (2013.01); *G06F 12/0246* (2013.01); *G06F 12/0638* (2013.01); *G11C 7/06* (2013.01); *G11C 7/062* (2013.01); *G11C 13/004* (2013.01); *G11C 13/0023* (2013.01); *G11C 13/0061* (2013.01); *G11C 13/0069* (2013.01); *G11C 16/08* (2013.01); *G11C 16/10* (2013.01); *G11C 16/26* (2013.01); *G11C 16/28* (2013.01); *G06F 2212/7204* (2013.01); *G11C 8/10* (2013.01); *G11C 2013/0042* (2013.01); *G11C 2211/5646* (2013.01); *G11C 2216/22* (2013.01)

(58) Field of Classification Search
CPC ......... G11C 11/005; G11C 7/06; G11C 7/062; G06F 3/068; G06F 12/0638
USPC ....................................... 365/189.2; 711/103
See application file for complete search history.

(56) References Cited

U.S. PATENT DOCUMENTS

| | | | | |
|---|---|---|---|---|
| 6,141,256 | A * | 10/2000 | Forbes | G11C 11/5621 365/185.33 |
| 2007/0288683 | A1* | 12/2007 | Panabaker | G06F 12/06 711/101 |
| 2011/0051522 | A1* | 3/2011 | Luo | G11C 16/10 365/185.21 |
| 2012/0084491 | A1* | 4/2012 | Park | G06F 12/0246 711/103 |

\* cited by examiner

*Primary Examiner* — Vu A Le
(74) *Attorney, Agent, or Firm* — Turk IP Law, LLC

(57) ABSTRACT

A memory system includes a code flash and data flash merged flash memory, which may contain a code flash with differential cell structure, a data flash with single cell structure, decoder circuitry, a sense amplifier, and other suitable support circuitry. The code flash and data flash may be located in a same plane or multi planes. In some examples, the code flash may be also accessed to read while the data flash is performing write operation, and vice versa.

19 Claims, 9 Drawing Sheets

HYBRID FLASH MEMORY STRUCTURE

CROSS REFERENCE TO RELATED APPLICATIONS

This application claims the benefit of U.S. Provisional Patent Application Ser. No. 62/522,635 filed on Jun. 20, 2017. The disclosures of the above-referenced application are hereby incorporated by reference for all purposes.

BACKGROUND

Unless otherwise indicated herein, the materials described in this section are not prior art to the claims in this application and are not admitted to be prior art by inclusion in this section.

Based on storage capabilities, access speeds, power consumption, and other design considerations, different memory types may be used to store different types of data. For example, computers are desired to be designed for fast boot-up or wake-up times. At boot-up or wake-up time, a computer needs to retrieve data from memory and execute essential programs. For other operations, for example during execution of programs, large amounts of data may need to be stored, but the speed of storage may not be the most important consideration. In practical designs, ultra-fast differential cells may be used to store code and high-density single cells may be used to store data for example.

SUMMARY

Briefly stated, technologies are generally described herein for hybrid flash memory structures.

An example memory system may include a code flash and data flash merged flash memory, which may contain a code flash with differential cell structure, a data flash with single cell structure, decoder circuitry, a sense amplifier, and other suitable support circuitry. The code flash and data flash may be located in a same plane or multi planes. In some examples, the code flash may be also accessed to read while the data flash is performing write operation, and vice versa.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

Figure 1A:
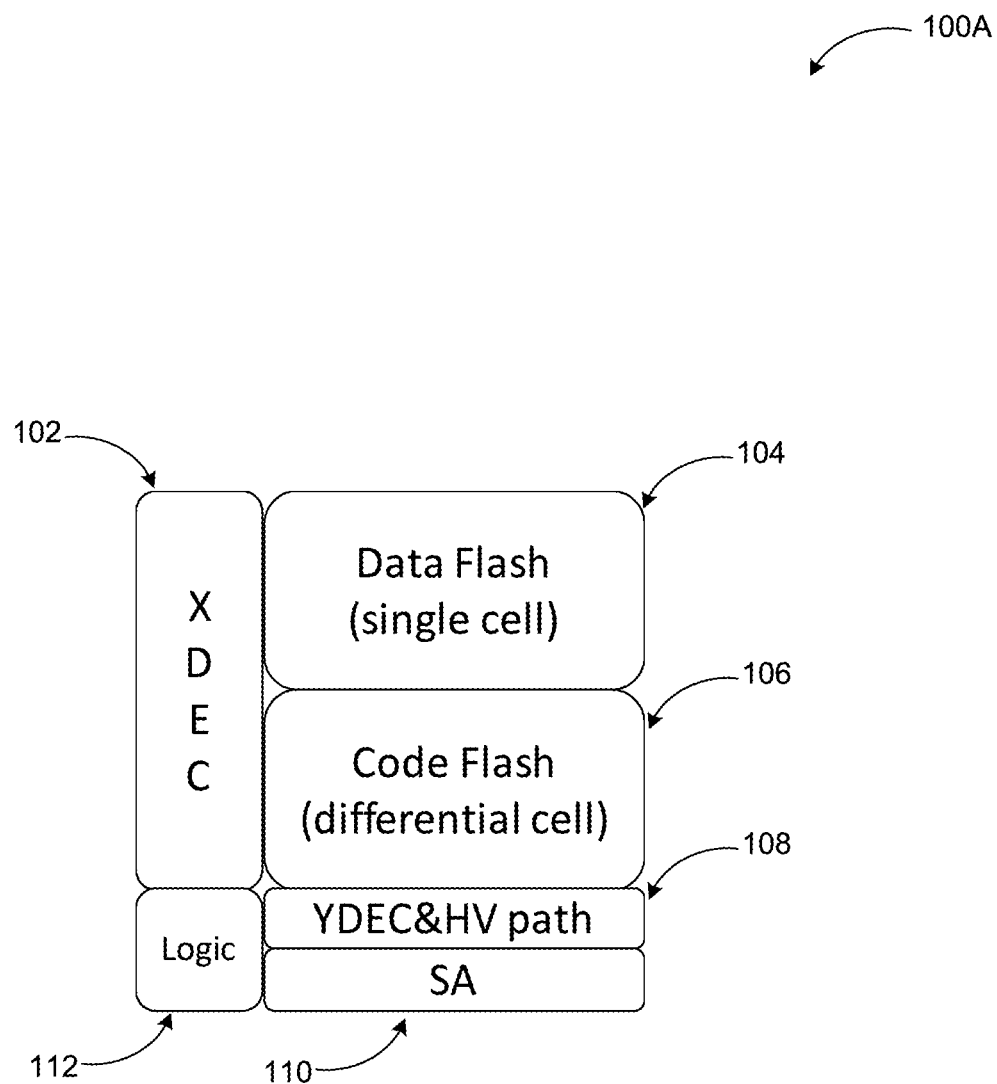
FIGS. 1A and 1B are diagrams illustrating an example hybrid flash memory structure.

all arranged according to at least some embodiments presented herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description and drawings are not meant to be limiting. Other embodiments may be utilized, and other changes may be made, without departing from the spirit or scope of the subject matter presented herein. The aspects of the present disclosure, as generally described herein, and illustrated in the figures, can be arranged, substituted, combined, separated, and designed in a wide variety of different configurations, all of which are explicitly contemplated herein.

This disclosure is generally drawn, inter alia, to technologies for hybrid flash memory structures. In some examples, the hybrid memory may include a code flash and data flash merged flash memory, which may contain a code flash with differential cell structure, a data flash with single cell structure, decoder circuitry, a sense amplifier, and other suitable support circuitry. The code flash and data flash may be located in a same plane or multi planes. In some examples, the code flash may be also accessed to read while the data flash is performing write operation, and vice versa.

As used herein, a memory may include, but is not limited to, a floating gate memory, a SONOS memory, a RRAM (resistive RAM), phase change memories, or magnetic base memories, such as MRAM, and STTRAM, or a Ferroelectric based RAM, or Ferroelectric capacitor based memory.

Figure 1B:
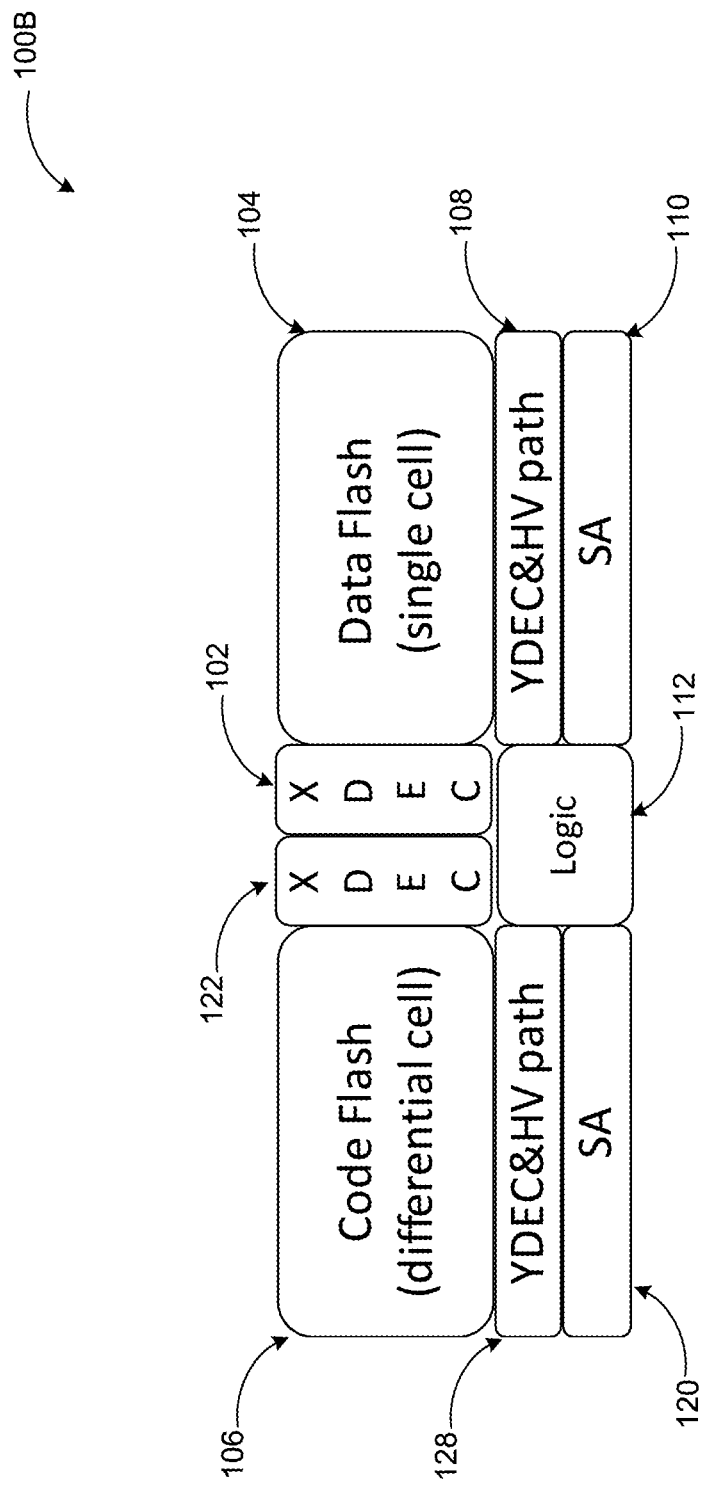

FIGS. 1A and 1B are diagrams illustrating example hybrid flash memory structures, arranged according to at least some embodiments presented herein.

Diagram 100A shows an example hybrid flash memory structure that includes a data flash 104, a code flash 106, and support circuitry such as x-decoder 102, y-decoder and high voltage path 108, logic circuitry 112, and sense amplifier 110. The x-decoder and the y-decoder may be used to decode data along the x- and y-axes of the two-dimensional memory circuits. Logic circuitry 112 may include control circuitry. Code flash 106 may include differential cell structure (that is two identical flash memory cells are paired to store data/code). The data flash 104 may include single cell structure (that is one flash memory cell is used to store data/code).

The code flash 106 with differential cell structure may have a very large read margin and use a shorter read timing to provide very fast access speeds. The code flash 106 may store frequently used code/data to improve the system performance and/or reduce system power consumption. The code flash 106 may also store the boot code, which may improve the boot speed after power on, release form deep sleep, or system reset and etc. In some examples, the code flash and the data flash may be on the same plane and thus share the same x-decoder and y-decoder.

Diagram 100B shows another configuration of a hybrid memory structure, where the code flash 106 and the data flash 104 are on different planes. Thus, each flash may have its own set of decoders, sense amplifiers, and high voltage paths such as x-decoder 102, y-decoder and high voltage path 108, and sense amplifier 110 for data flash 104. Similarly, x-decoder 122, y-decoder and high voltage path 128, and sense amplifier 120 may be used for code flash 106. Logic circuitry 112 may be used to manage both flashes. In some examples, the code flash 106 may be also accessed to read while the data flash is performing write operation, and vice versa.

Figure 2:
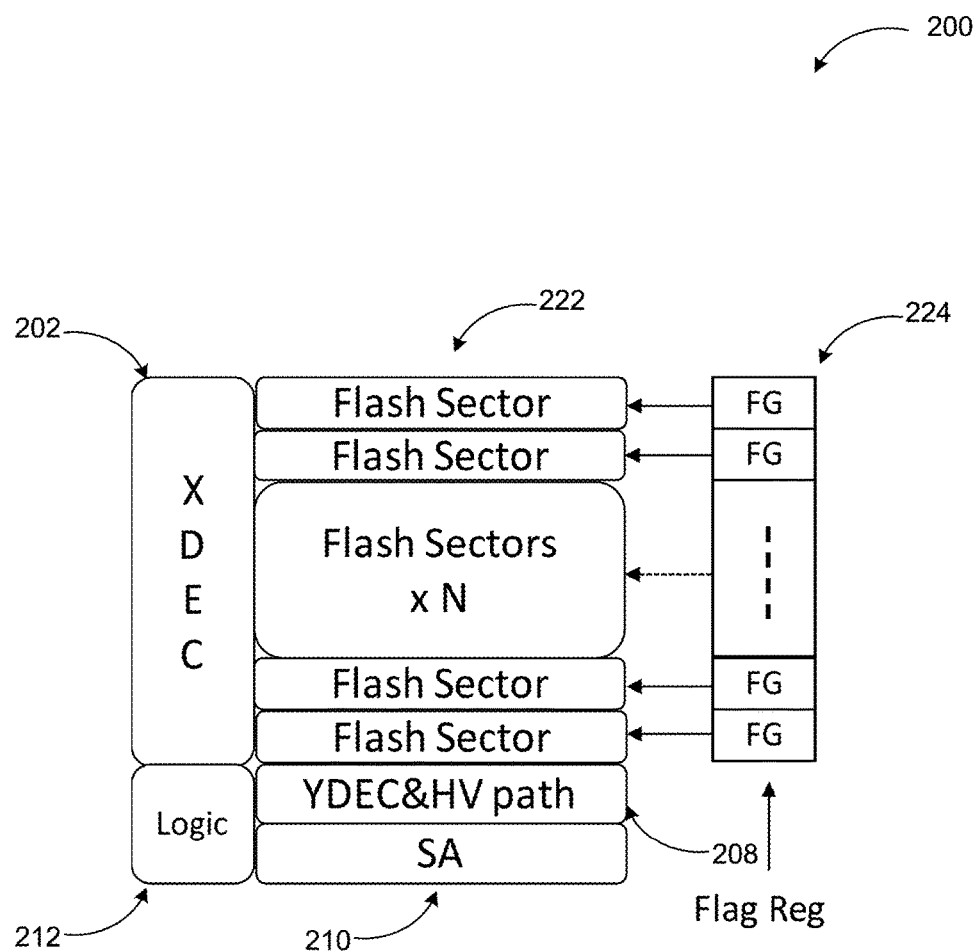
FIG. 2 is a diagram illustrating an example a hybrid flash memory structure with multiple sectors, where each sector may be configured as a code flash or data flash individually.

FIG. 2 is a diagram illustrating an example a hybrid flash memory structure with multiple sectors, where each sector may be configured as a code flash or data flash individually, arranged according to at least some embodiments presented herein.

Diagram 200 shows a hybrid flash memory structure with multiple sectors, where each sector may be configured as a code flash or data flash individually. x-decoder 202, y-decoder and high voltage path 208, sense amplifier 210, and logic circuitry 212 may be configured and function as described above. The flash portion 222 of the hybrid memory may include a predetermined number (N) of flash sectors, each of which may be configured as data flash or code flash. A flag register 224 may be used to indicate configuration status of each of the flash sectors.

The flash memory may contain a flag register 224. Bits in the flag register 224 may configure each flash sector as a code flash or data flash. For example, all bits in the flag register may be set to '0' as a default value, and all the flash sectors may be configured as data flash. And when bit 0 in the flag register is set to '1', the flash sector 0 may be configured as a code flash. When a flash sector is configured as a data flash, that flash sector may use a single cell structure; and when a flash sector is configured as a code flash, that flash sector may use a differential cell structure. When a flash sector is configured as a data flash, the read access speed may be set to a slow speed; and when a flash sector is configured as a code flash, the read access speed may be set to a fast speed.

Figure 3:
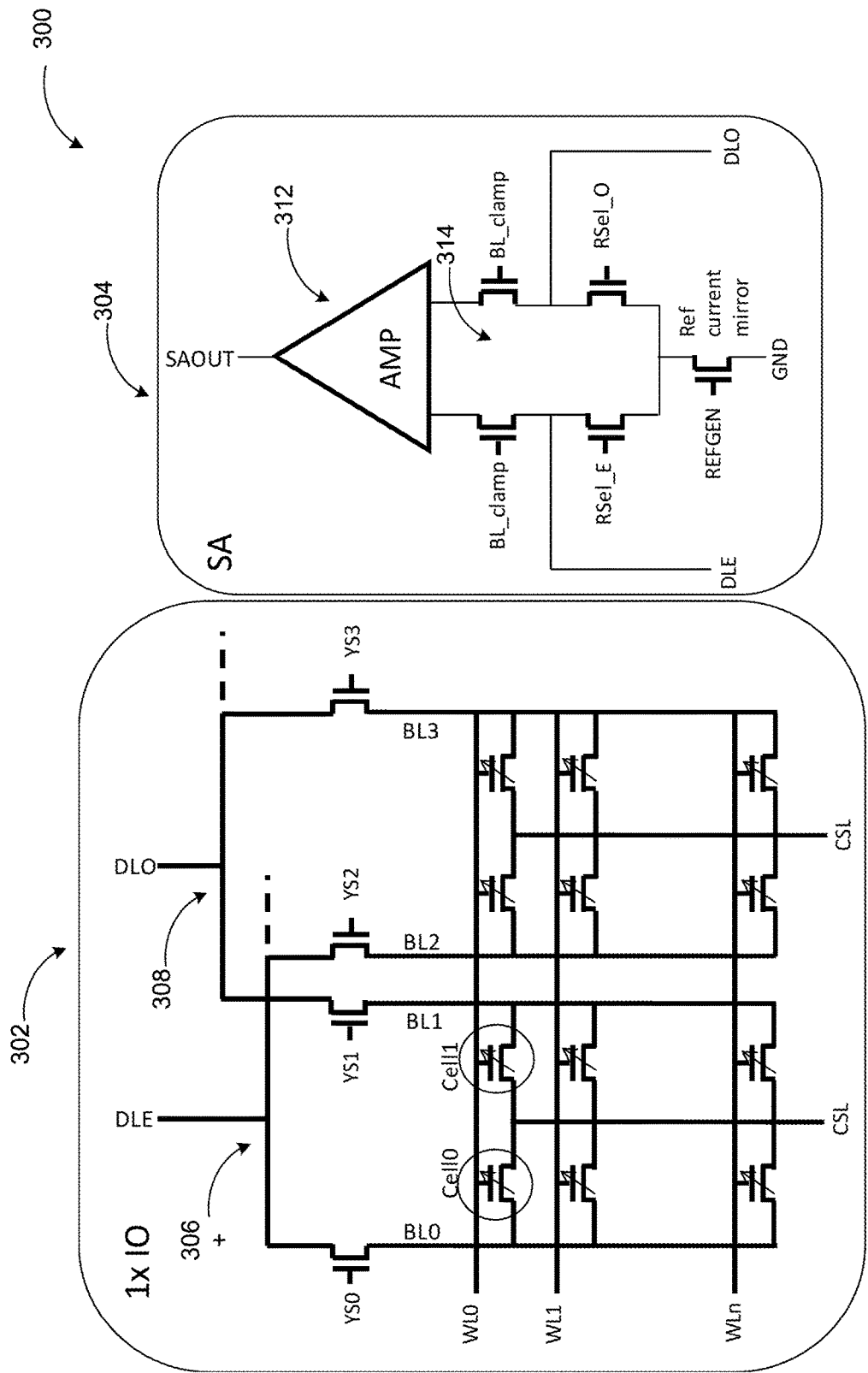
FIG. 3 is a schematic diagram illustrating an example memory cell structure.

FIG. 3 is a schematic diagram illustrating an example memory cell structure, arranged according to at least some embodiments presented herein.

Diagram 300 shows an example memory cell structure with an input/output (I/O) 302 and sense amplifier 304. Every IO may contain multiple columns and a pair of DLE/DLO (data lines) coupled to a sense amplifier SA. DLE/DLO may be connected to the bitline array BL through Y-decode signal YSx. The connections are not limited to those shown in the figure. The SA 304 may contain a reference current mirror to generate the reference current for single cell operation. The SA 304 may also have a switcher 314 to select the DLE or DLO as the reference side, while the other side is the cell side. The reference current mirror may be turned off for differential cell operation.

In a single cell operation, DLE may connect to a memory cell (e.g. cell 0) while DLO may connect to a reference. Alternatively, DLE may connect to a reference while DLO may connect to a memory cell (e.g. cell 1). In a differential cell operation, DLE may connect to a memory cell (e.g. cell 0) while DLO may connect to another memory cell (e.g. cell 1). In some examples, no reference current need. The cells 0 and 1 may work as 1-bit storage. In a write operation, the differential cell may write the cells 0 and 1 as a '0'/'1' or a '1'/'0' state.

Figure 4:
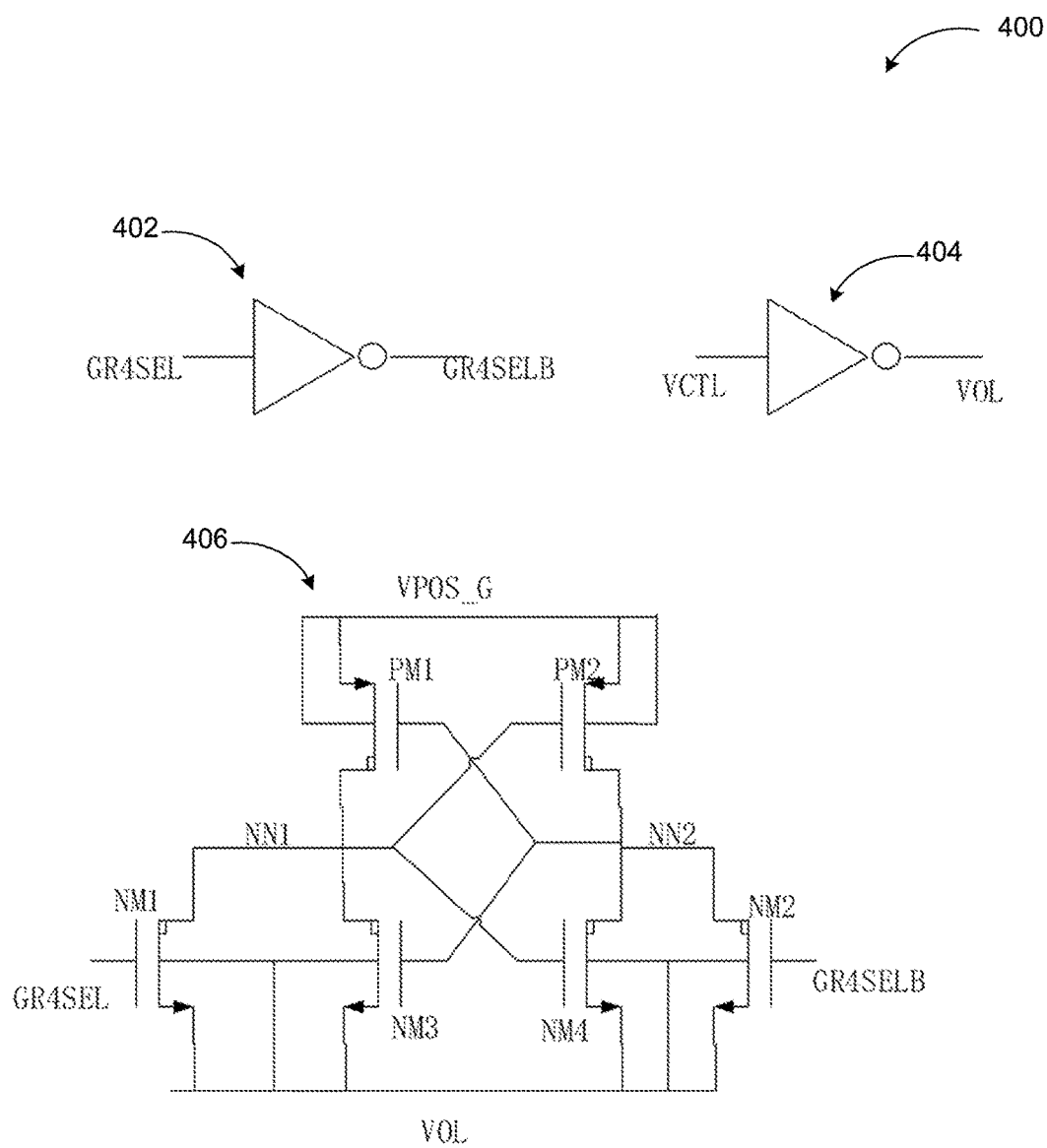
FIG. 4 is a schematic diagram illustrating an example memory cell.

FIG. 4 is a schematic diagram illustrating an example memory cell, arranged according to at least some embodiments presented herein.

Signals GR4SELB and VOL shown in diagram 400 may be obtained through inversion of signals GR4SEL and VCTL as shown by 402 and 404. In the circuit 406, NM1, NM2, NM3, and NM4 may be N-type Drain Extension FETs. PM1, PM2 may be P-type Drain Extension FETs. The inverters 402, 404 may be MOSFETs.

Figure 5:
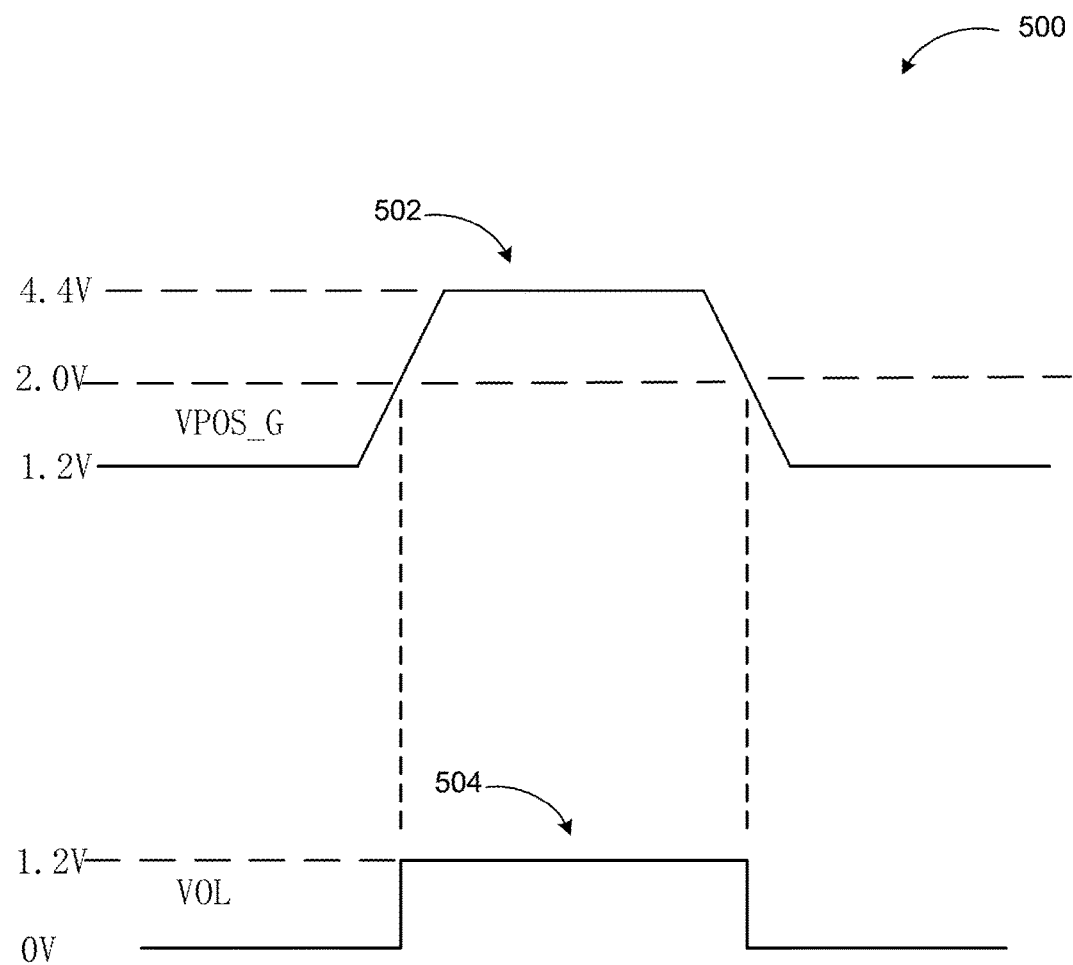
FIG. 5 is a diagram illustrating example waveforms in the example circuit of FIG. 4.

FIG. 5 is a diagram illustrating example waveforms in the example circuit of FIG. 4, arranged according to at least some embodiments presented herein.

Diagram 500 shows an example key waveform. When level shift happens VOL may jump (504). That way |VGS| can be kept under certain voltages (502) to prevent breakdown. For example, in the diagram, when VPOS_G increases to 2V, VOL may jump from 0V to 1.2V. That way, |VGS|<3.6V may be achieved to prevent breakdown.

Figure 6:
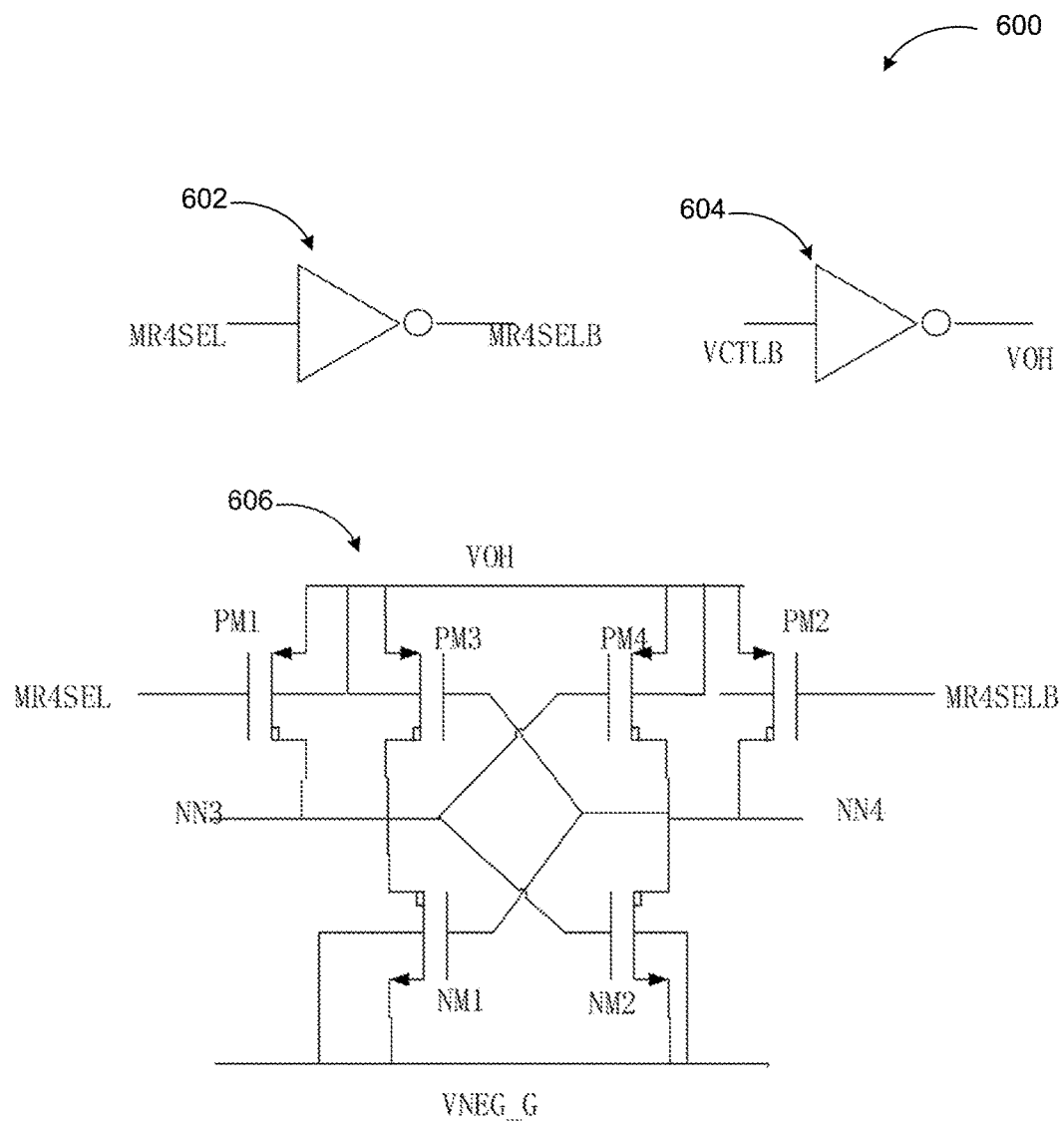
FIG. 6 is a schematic diagram illustrating another example memory cell.

FIG. 6 is a schematic diagram illustrating another example memory cell, arranged according to at least some embodiments presented herein.

Signals MR4SELB and VOH shown in diagram 600 may be obtained through inversion of signals MR4SEL and VCTLB as shown by 602 and 604. In the circuit 606, NM1 and NM2 may be N-type Drain Extension FETs. PM1, PM2, PM3, PM4 may be P-type Drain Extension FETs. The inverters 602, 604 may be MOSFETs.

The hybrid memory may include one or more memory blocks with NVM cells. The NVM cells may be charge-tapping based flash memory cells, SONOS flash cells, floating gate flash memory cells, Resistance based RRAM memory cells, MRAM, or ferroelectric RAM cells. The different memory blocks (fast SRAM/non-volatile memory hybrid blocks and non-volatile memory blocks) may utilize a single, unified interface to communicate with other devices/circuits in some examples.

Figure 7:
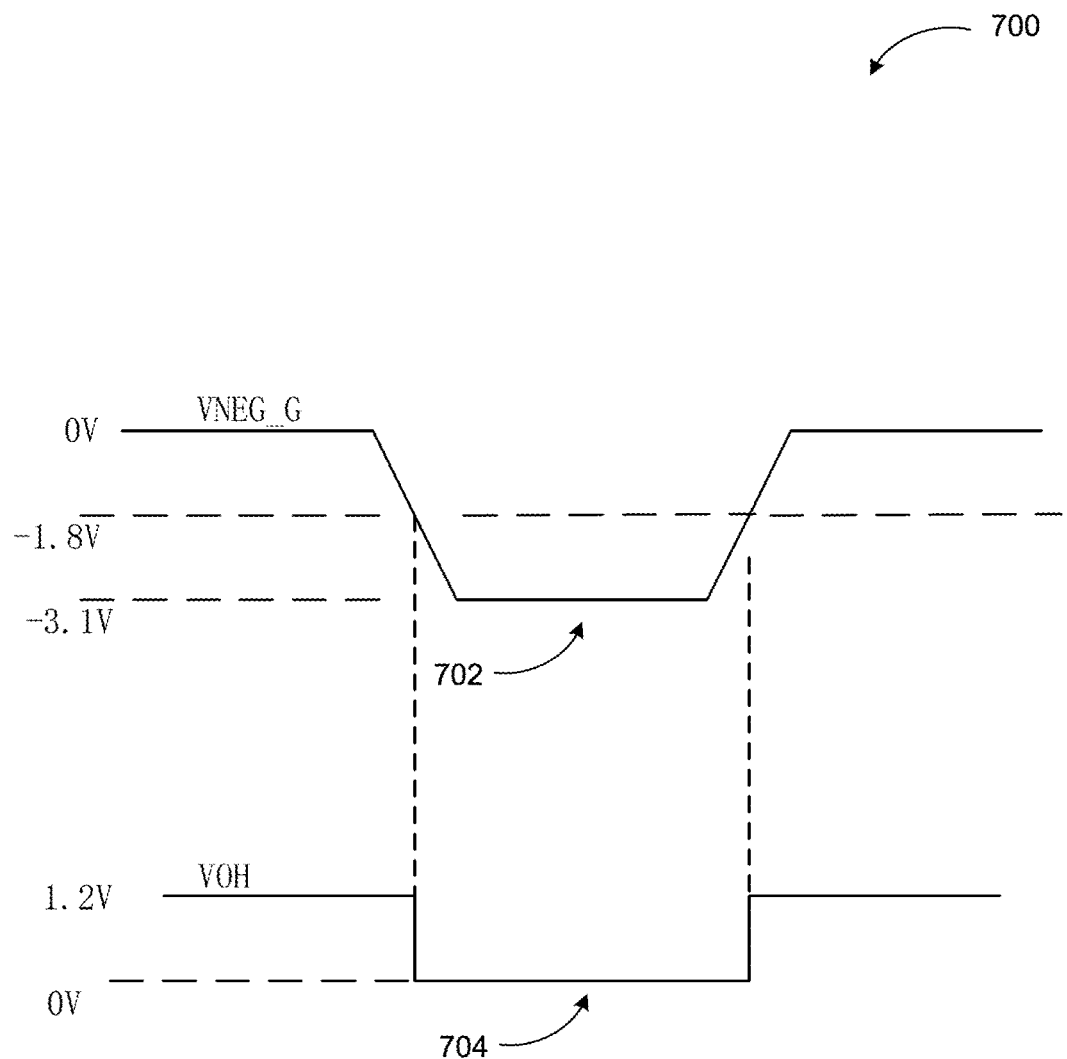
FIG. 7 is a diagram illustrating example waveforms in the example circuit of FIG. 6.

FIG. 7 is a diagram illustrating example waveforms in the example circuit of FIG. 6, arranged according to at least some embodiments presented herein.

Diagram 600 shows an example key waveform. When level shift happens VOH may shift (704). That way |VGS| can be kept under certain voltages (702) to prevent breakdown. For example, in the diagram, when VNEG G reaches to −1.8V, VOH may shift from 1.2V to 0V. That way, |VGS|<3.6V may be achieved to prevent breakdown.

Various types of transistors may be used in embodiments. The disclosure may use, for purposes of illustration, metal-oxide semiconductor field effect transistors (MOSFET). A MOSFET may have a source terminal (e.g., a first terminal), a drain terminal (e.g., a second terminal), and a control terminal. When an appropriate level of bias signal is applied to the control terminal, the transistor may be activated (e.g., biased into active operation) wherein conduction between the source terminal and the drain terminal may be facilitated. Depending on the type of transistor (e.g., N-type or P-type), an appropriate level of bias signal may be applied, or previously applied bias signal may be removed, to cause the transistor to be deactivated wherein conduction between the source and the drain may be abated. A MOSFET "terminal" may also be termed a "port."

A hybrid memory according to embodiments is not limited to floating gate memories, but may also be a SONOS memory, a RRAM (resistive RAM), phase change memories, or magnetic base memories, such as MRAM, and STTRAM, or a Ferroelectric based RAM, a Ferroelectric capacitor based memory, or comparable NVMs.

Some embodiments are directed to example processes to operate hybrid flash memory structures. The operations of any process described herein are not necessarily presented in any particular order and that performance of some or all of the operations in an alternative order(s) is possible and is contemplated. The operations have been presented in the demonstrated order for ease of description and illustration. Operations may be added, combined, modified, omitted, and/or performed simultaneously, in a different order, etc., without departing from the scope of the present disclosure.

The illustrated process can be ended at any time and need not be performed in its entirety. Some or all operations of the processes, and/or substantially equivalent operations, can be performed by execution by one or more processors of computer-readable instructions included on a computer storage media, such as described herein, including a tangible non-transitory computer-readable storage medium. The term "computer-readable instructions," and variants thereof, as used in the description and claims, is used expansively herein to include routines, applications, application modules, program modules, programs, components, data structures, algorithms, or the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, or the like.

Figure 8:
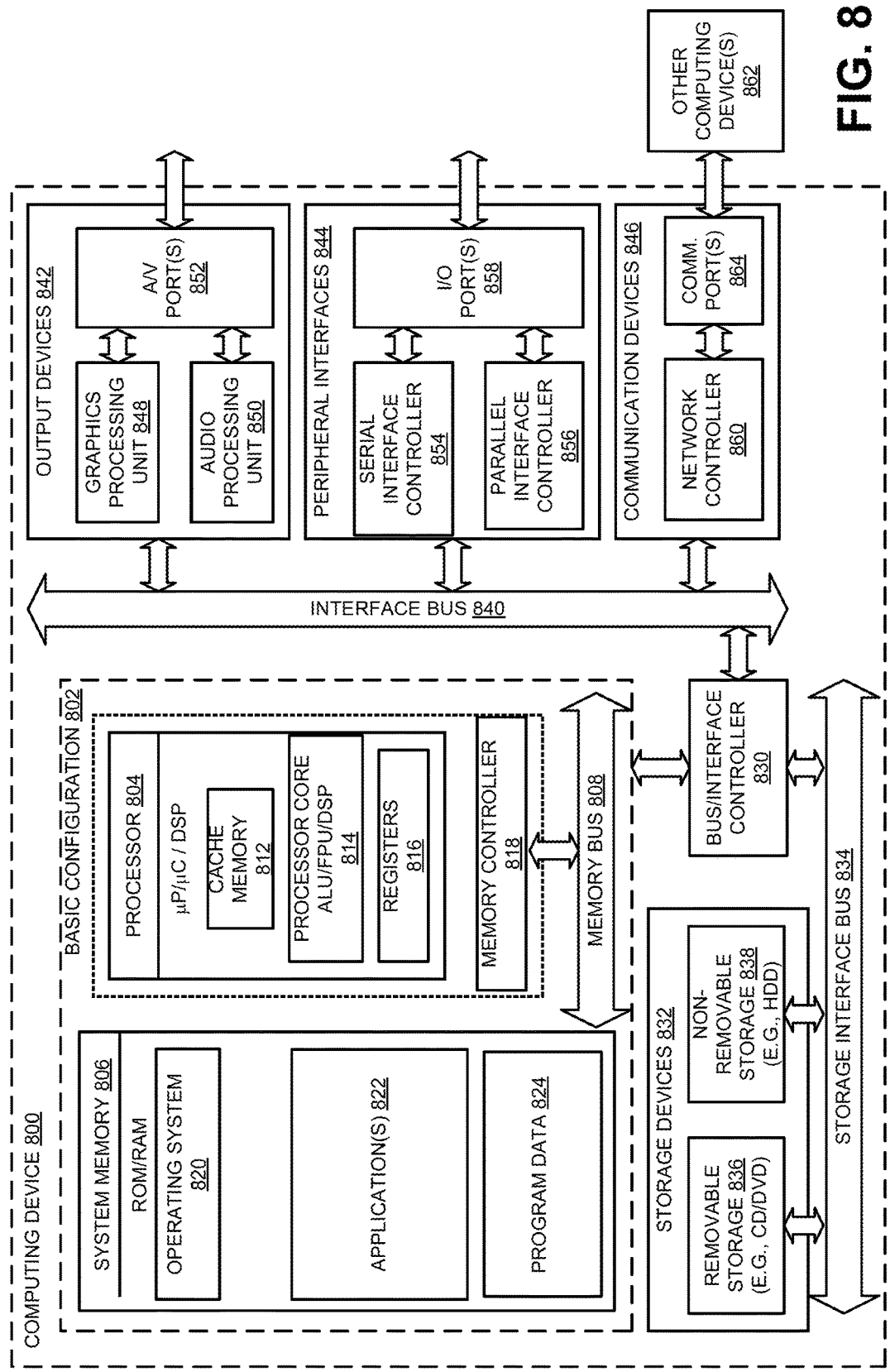
FIG. 8 is a block diagram illustrating an example computing device that is arranged for implementing example hybrid flash memory structures as discussed herein.

FIG. 8 is a block diagram illustrating an example computing device 800 that is arranged for implementing and/or operating hybrid flash memory structures as discussed herein, in accordance with at least some embodiments described herein. In a very basic configuration 802, computing device 800 typically includes one or more processors 804 and system memory 806. A memory bus 808 can be used for communicating between the processor 804 and the system memory 806.

Depending on the desired configuration, processor 804 can be of any type including but not limited to a microprocessor (μP), a microcontroller (μC), a digital signal processor (DSP), or any combination thereof. Processor 804 can include one more levels of caching, such as cache memory 812, a processor core 814, and registers 816. The processor core 814 can include an arithmetic logic unit (ALU), a floating point unit (FPU), a digital signal processing core (DSP core), or any combination thereof. A memory controller 818 can also be used with the processor 804, or in some implementations the memory controller 88 can be an internal part of the processor 804.

Depending on the desired configuration, the system memory 806 can be of any type including but not limited to volatile memory (such as RAM), non-volatile memory (such as ROM, flash memory, etc.) or any combination thereof. System memory 806 typically includes an operating system 820, one or more applications 822, and program data 824.

Computing device 800 can have additional features or functionality, and additional interfaces to facilitate communications between the basic configuration 802 and any required devices and interfaces. For example, a bus/interface controller 840 can be used to facilitate communications between the basic configuration 802 and one or more data storage devices 832 via a storage interface bus 834. The data storage devices 832 can be removable storage devices 836, non-removable storage devices 838, or a combination thereof. Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media can include volatile and nonvolatile, removable and non-removable media implemented in any method or technology for storage of information, such as computer readable instructions, data structures, program modules, or other data.

System memory 806, removable storage 836 and non-removable storage 838 are all examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which can be used to store the desired information and which can be accessed by computing device 800. Any such computer storage media can be part of device 800. Thus, any of the computer storage media may be implemented using the SRAM based memory structures as discussed herein.

Computing device 800 can also include an interface bus 840 for facilitating communication from various interface devices (e.g., output interfaces, peripheral interfaces, and communication interfaces) to the basic configuration 802 via the bus/interface controller 830. Example output devices 842 include a graphics processing unit 848 and an audio processing unit 850, which can be configured to communicate to various external devices such as a display or speakers via one or more A/V ports 852. Example peripheral interfaces 844 include a serial interface controller 854 or a parallel interface controller 856, which can be configured to communicate with external devices such as input devices (e.g., keyboard, mouse, pen, voice input device, touch input device, etc.) or other peripheral devices (e.g., printer, scanner, etc.) via one or more I/O ports 858. An example communication device 846 includes a network controller 860, which can be arranged to facilitate communications with one or more other computing devices 862 over a network communication via one or more communication ports 864. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, communication media can include wired media such as a wired network or direct-wired connection, and wireless media such as acoustic, radio frequency (RF), infrared (IR) and other wireless media. The term computer readable media as used herein can include both storage media and communication media.

Computing device 800 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 800 can also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, compounds, or compositions, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations.

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include, but not be limited to, systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

Further, the use of the terms "first," "second," "third," "fourth," and the like is to distinguish between repeated instances of a component or a step in a process and does not impose a serial or temporal limitations unless specifically stated to require such serial or temporal order.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," or the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A hybrid flash memory device comprising:
   a code flash memory comprising differential memory cells;
   a data flash memory comprising single memory cells; and
   support circuitry comprising at least a decoder, a sense amplifier, logic circuitry, and a flag register, the flag register comprising a plurality of bits corresponding to the multiple sectors of the hybrid flash memory device and each of the plurality of bits representing a configuration of a corresponding flash memory sector.

2. The device of claim 1, wherein the code flash memory is fast access memory and the data flash memory is high density memory.

3. The device of claim 1, wherein the decoder comprises an x-decoder and a y-decoder.

4. The device of claim 1, wherein
   the code flash memory is configured to be accessed for a read operation while the data flash memory is performing a write operation; and
   the code flash memory is configured to perform a write operation while the data flash memory is being accessed for a read operation.

5. The device of claim 1, wherein the code flash memory and the data flash memory are on a same plane and configured to share the support circuitry.

6. The device of claim 1, wherein the code flash memory and the data flash memory are on different planes and at least a portion of the support circuitry is dedicated to the code flash memory and the data flash memory, respectively.

7. The device of claim 1, wherein the code flash memory is configured to store one or more of a boot code, a wake-up code, and an executable code for a computing system.

8. The device of claim 1, wherein the code flash memory and the data flash memory include SONOS transistor cells, floating gate cells, eFlash cells, pFlash cells, 1T/1R resistive RAMs, resistive memory based cells, phase change memory based cells, ferroelectric RAM based cells, ferroelectric capacitor based cells, or magnetic RAM based cells.

9. A hybrid flash memory device comprising:
a flash memory comprising multiple sectors, wherein each sector is configurable as one of a code flash memory with differential memory cells and a data flash memory with single memory cells;
a flag register comprising a plurality of bits corresponding to the multiple sectors of the flash memory and each of the plurality of bits representing a configuration of a corresponding flash memory sector; and
support circuitry comprising at least a decoder, a sense amplifier, and logic circuitry.

10. The device of claim 9, wherein a flash memory sector is re-configurable by setting a value of a corresponding bit in the flag register.

11. The device of claim 9, wherein
when a flash sector is configured as the data flash memory, the flash sector uses a single cell structure; and
when the flash sector configured as the code flash memory, the flash sector uses a differential cell structure.

12. The device of claim 9, wherein
when a flash sector is configured as the data flash memory, a read access speed for the flash sector is set to a slow speed; and
when the flash sector configured as the code flash memory, the read access speed is set to a slow speed.

13. The device of claim 9, wherein the support circuitry is configured to support all sectors of the flash memory.

14. A hybrid flash memory device comprising:
a code flash memory comprising differential memory cells, wherein the code flash memory is fast access memory;
a data flash memory comprising single memory cells, wherein the data flash memory is high density memory; and
support circuitry comprising at least a decoder, a sense amplifier, logic circuitry, and a flag register, the flag register comprising a plurality of bits corresponding to the multiple sectors of the hybrid flash memory device and each of the plurality of bits representing a configuration of a corresponding flash memory sector.

15. The device of claim 14, wherein each input/output (I/O) includes multiple columns of bitlines and a pair of DLE/DLO data lines coupled to the sense amplifier.

16. The device of claim 15, wherein the DLE/DLO datalines are connected to the bitlines through a y-decode signal.

17. The device of claim 14, wherein sense amplifier includes a reference current mirror to generate a reference current for single cell operation.

18. The device of claim 17, wherein sense amplifier further includes a switcher to select the DLE or DLO datalines as a reference side while another side is a cell side.

19. The device of claim 17, wherein the reference current mirror is turned off for a differential cell operation.

* * * * *